(12) United States Patent
Gardner et al.

(10) Patent No.: US 8,361,594 B2
(45) Date of Patent: ***Jan. 29, 2013

(54) METHODS OF FORMING MAGNETIC VIAS TO MAXIMIZE INDUCTANCE IN INTEGRATED CIRCUITS AND STRUCTURES FORMED THEREBY

(75) Inventors: Donald Gardner, Mountain View, CA (US); Gerhard Schrom, Hillsboro, OR (US); Peter Hazucha, Beaverton, OR (US); Fabrice Paillet, Hillboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1161 days.

This patent is subject to a terminal disclaimer.

(21) Appl. No.: 11/936,724

(22) Filed: Nov. 7, 2007

(65) Prior Publication Data

US 2009/0117325 A1    May 7, 2009

(51) Int. Cl.
*B32B 3/24* (2006.01)
*H01F 7/06* (2006.01)
*H01F 5/00* (2006.01)

(52) U.S. Cl. ........ 428/138; 428/900; 336/200; 29/602.1

(58) Field of Classification Search .................. 428/138, 428/900; 336/300; 29/602.1
See application file for complete search history.

(56) References Cited

U.S. PATENT DOCUMENTS

| | | | |
|---|---|---|---|
| 6,204,997 B1 * | 3/2001 | Sasaki | 360/123.39 |
| 7,423,508 B2 * | 9/2008 | Gardner et al. | 336/200 |
| 2005/0133924 A1 | 6/2005 | Crawford et al. | |

FOREIGN PATENT DOCUMENTS

| | | |
|---|---|---|
| JP | 07-066050 A | 3/1995 |
| JP | 11-82258 A | 8/1997 |
| WO | 2009/061789 A2 | 5/2009 |
| WO | 2009/061789 A3 | 9/2009 |

OTHER PUBLICATIONS

International Search Report and Written Opinion of the International Searching Authority, for PCT Patent Application No. PCT/US2008/082443, Jul. 6, 2009, 11 pages.
International Preliminary Report on Patentability and Written Opinion for PCT Patent Application No. PCT/US2008/082443, May 20, 2010, 6 pages.

* cited by examiner

*Primary Examiner* — William P Watkins, III
(74) *Attorney, Agent, or Firm* — Forefront IP Lawgroup, PLLC

(57) ABSTRACT

Methods and associated structures of forming microelectronic devices are described. Those methods may include forming a first layer of a magnetic material on a substrate, forming an oxide layer on the first layer of the magnetic material, forming at least one conductive structure on the first magnetic layer, forming a dielectric layer on the at least one conductive structure, forming a second layer of the magnetic material on the at least one conductive structure, and forming a magnetic via coupled to the first and second layers of the magnetic material, wherein the magnetic via comprises a shape to increase inductance of the inductive structure.

19 Claims, 6 Drawing Sheets

METHODS OF FORMING MAGNETIC VIAS TO MAXIMIZE INDUCTANCE IN INTEGRATED CIRCUITS AND STRUCTURES FORMED THEREBY

BACKGROUND OF THE INVENTION

Magnetic materials may be used to fabricate microelectronic devices, such as inductor and transformer devices. Inductors and transformer structures may be used in microelectronic circuits such as on-chip and on-package voltage converters, RF high-frequency circuits, radar applications and EMI noise reduction circuits. To obtain the maximum inductance, magnetic flux loss should be minimized to avoid significant loss in inductance.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
FIGS. 1a-1m represent structures according to embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include forming a first layer of a magnetic material on a substrate, forming an oxide layer on the first layer of the magnetic material, forming at least one conductive structure on the first magnetic layer, forming a dielectric layer on the at least one conductive structure, forming a second layer of the magnetic material on the at least one conductive structure, and forming a magnetic via coupled to the first and second layers of the magnetic material, wherein the magnetic via comprises a shape to increase inductance of the inductive structure. Methods of the present invention enable the fabrication of microelectronic devices, such as, for example, inductor and transformer structures. Such microelectronic devices may comprise via structures that are optimized to obtain good inductance values, thus allowing for improved device performance.

FIGS. 1a-1j illustrate an embodiment of a method of forming a microelectronic structure, such as an inductor structure, for example. FIG. 1a illustrates a cross-section of a portion of a substrate 100. The substrate 100 may be comprised of materials such as, but not limited to, silicon, silicon-on-insulator, germanium, indium antimonide, lead telluride, indium arsenide, indium phosphide, gallium arsenide, gallium antimonide, or combinations thereof.

The substrate 100 may further comprise microelectronic packaging materials and structures as are known in the art. In one embodiment, the substrate 100 may include transistors and other devices that, together, form a microprocessor. In an embodiment, the substrate 100 may include devices that together form multiple microprocessor cores on a single die. In one embodiment, the substrate may include CMOS (complementary metal oxide semiconductor) devices comprising multi-level metallization.

Figure 1B:
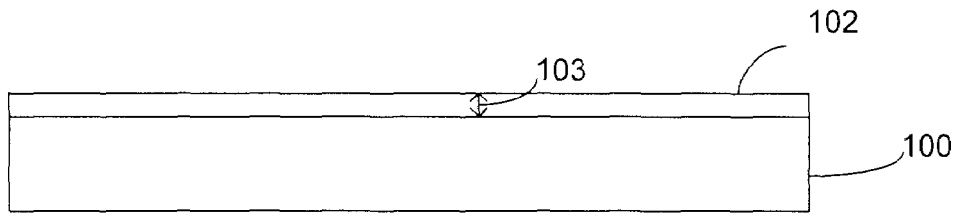

A first layer of a magnetic material 102 may be formed on the substrate 100 (FIG. 1b). In one embodiment, the magnetic material 102 may comprise high-frequency amorphous magnetic materials. In some embodiments, the magnetic material 102 may comprise such materials as CoZrTa, CoZrNb, NiFe, CoP, COPB, CoPRe, CoZr, CoZr Mo, FeCoAlN, CoZrTaN, FeCoP, COPW, CoPBW, FeTaN, FeCoBSi, and combinations thereof. The first layer of magnetic material 102 may comprise a thickness 103 of about 0.1 microns to about 10 microns.

Figure 1C:
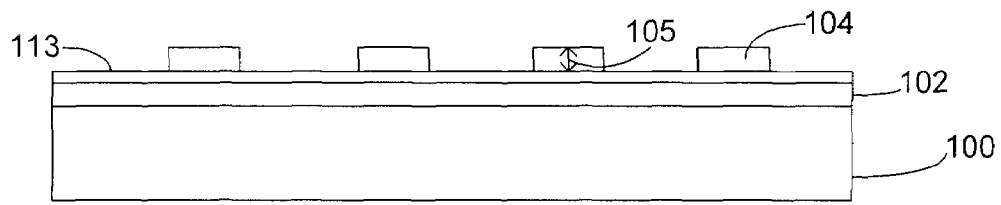

The first layer of magnetic material 102 may be formed utilizing deposition techniques such as sputtering, electroplating, chemical vapor deposition (CVD), or other thin-film depositions techniques, for example. In one embodiment, a sputtering method may be employed, wherein a thin titanium or tantalum adhesion may be formed underneath the magnetic material. In one embodiment, a thin layer of a dielectric material 113, such as an oxide material, may be formed on the first layer of magnetic material 102, and may comprise a thickness of about 250 nm to about 1000 nm angstroms in some embodiments (FIG. 1c). In other embodiments, little to no thin layer of dielectric material 113 may be present.

In one embodiment, at least one conductive structure 104 may be formed on the thin dielectric layer 113. In one embodiment, the at least one conductive structure 104 may comprise a copper interconnect structure, such as a copper wire structure for example, that may be used as inductor wires, in some cases, and may comprise a thickness 105 of about 1 to about 10 microns. The particular thickness 105 of the at least one conductive structure 104 will vary according to the particular application.

Figure 1D:
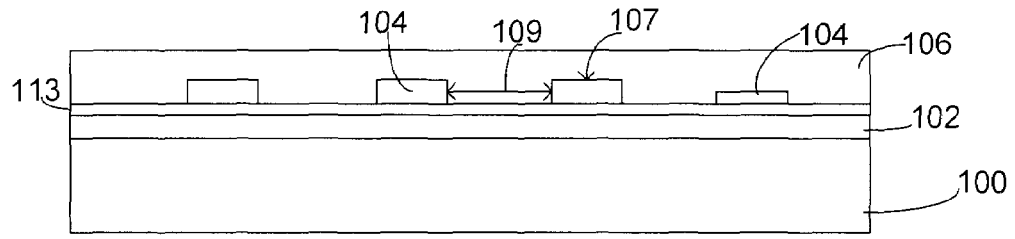

In one embodiment, the thickness 105 and dimensions of the at least one conductive structure 104 may be increased and/or optimized in order to obtain high Q-factors, and also to enable the handling of larger electrical currents. In some embodiments, a dielectric layer 106 such as polyimide layer 106 may be formed on and around the at least one conductive structure 104 (FIG. 1d). In one embodiment, the dielectric layer 106 may be formed on a top surface 107 and in the spaces 109 between the individual conductive structures 104.

A second layer of the magnetic material 108 may be formed on the at least one conductive structure 104 (FIG. 1e) to form an inductive structure 116. The inductive structure 116 may comprise various inductor and transformer structures/devices, for example, and may be used in microelectronic circuits such as on-chip and/or on package voltage converters, RF high-frequency circuits, radar and EMI noise reduction circuits. In some devices, to obtain a maximum theoretical increase in inductive magnetic flux, the two layers of magnetic material 102, 108 need to make contact so that the magnetic flux loss is minimized to zero. At high operating frequencies, the apparent inductance of prior art devices may gradually decrease with frequency because there are losses from eddy currents that flow in the magnetic material. Thus, carefully designed magnetic vias serve to maximize the inductance of such high frequency inductive structures.

Without a good magnetic connection, the magnetic flux may escape, resulting in significant loss in inductance for the device. The magnetic connection may comprise a magnetic via 110, which comprises the region wherein the first layer of magnetic material 102, and the second magnetic layer 108 make contact with each other to complete the circuit for the magnetic flux. The term "magnetic via" is used because the optimal structure for a magnetic via differs from an electrical via.

In one embodiment, the magnetic via 110 may be formed on the substrate 100, wherein the magnetic via 110 may be coupled to the first and second layers of the magnetic material 102, 108. In one embodiment, the magnetic via 110 may comprise a region wherein the first and second layers of the magnetic material 102, 108 contact each other. In one embodiment, the inductive structure 116 may comprise a portion of a submicron CMOS device, and may comprise high-frequency amorphous magnetic materials and multi-level metallization.

In one embodiment, the magnetic via 110 may comprise a height 114 and a width 112, wherein an aspect ratio of the magnetic via 110 may comprise a ratio of the height 114 to the width 112 that may comprise about 0.5 to about 1.5. In one embodiment, the inductance of the inductive structure 116 may be optimized by designing the magnetic via 110 to have an aspect ratio of about 1:1.

In some cases, filling the magnetic via 110 with a magnetic material that has good magnetic properties and minimal eddy currents in the vertical direction may be difficult. In those cases, the dielectric layer 106 may be formed/shaped so that edges 115 of the dielectric layer 106 are rounded (FIG. 1*k*, FIG. 1*l*). The magnetic material may then be formed on the rounded dielectric layer 106 in such a manner the sidewalls 111 of the magnetic vias 110 may be formed/shaped with rounded sidewalls 111 (FIG. 1*m*).

When the sidewalls 111 of the magnetic vias 110 are rounded as opposed to vertical, significantly higher inductance may be achieved in microelectronic devices utilizing the rounded magnetic vias of the present embodiment. In one embodiment, an inductance of the inductive structure 116 may comprise about 3 nH, which may include about a 3 times increase in inductance over prior art inductive structures. In other embodiments, about 27 times increase in inductance may be possible over inductance obtained without magnetic materials (which may comprise about 0.6 nH typically), depending upon the particular application optimization.

Figure 3:
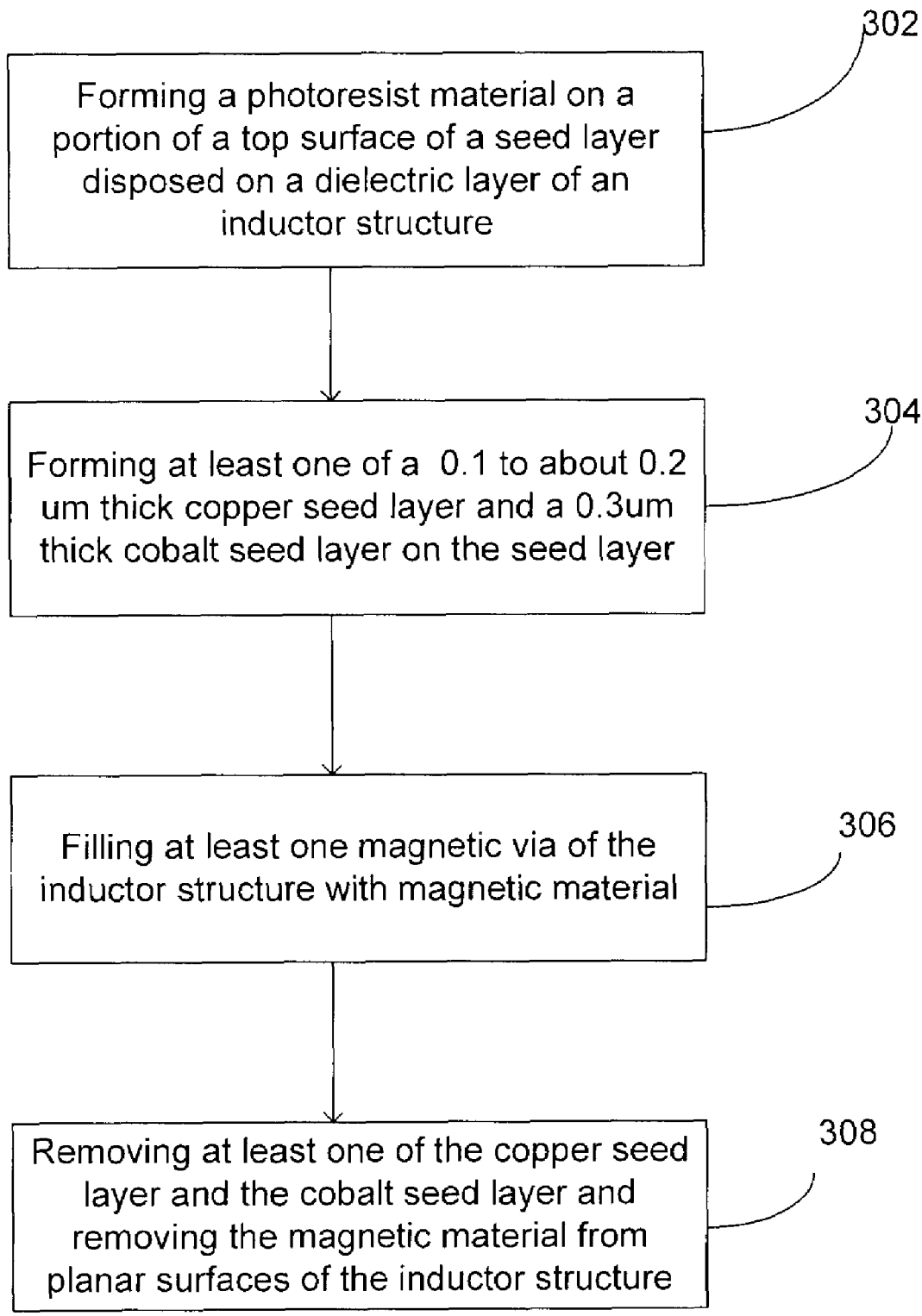
FIG. 3 represents a flow chart according to an embodiment of the present invention.

In one embodiment (FIG. 3), an electroplating process can be employed to form the magnetic material, wherein a photoresist material may first be formed on a top surface of a seed layer such as a 20 nm titanium layer, that may be disposed on the dielectric material 302. About a 0.1 to about 0.2 um thick copper seed layer or a 0.3 um thick cobalt seed layer may then be formed on the seed layer 304. Magnetic vias 110 may then be filled with magnetic material 306, and a chemical mechanical polishing (CMP) process can then be used to remove the copper seed layer and magnetic material from planar surfaces of the inductor structure 308. In another embodiment, the magnetic material can also be deposited using electroless plating thereby eliminating the need for a seed layer.

Figure 1E:
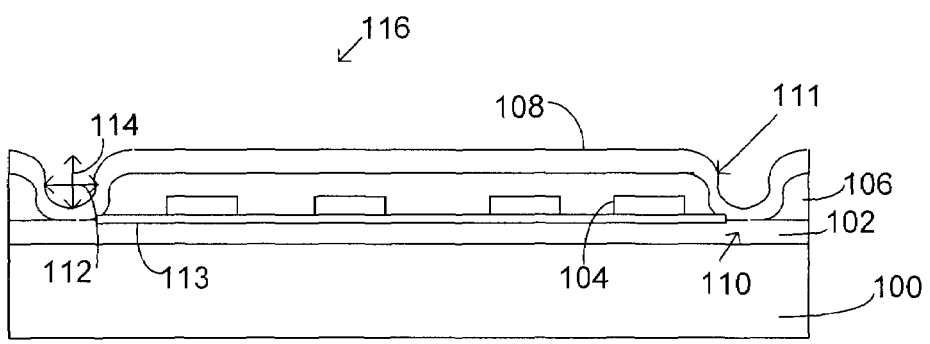
Figure 1F:
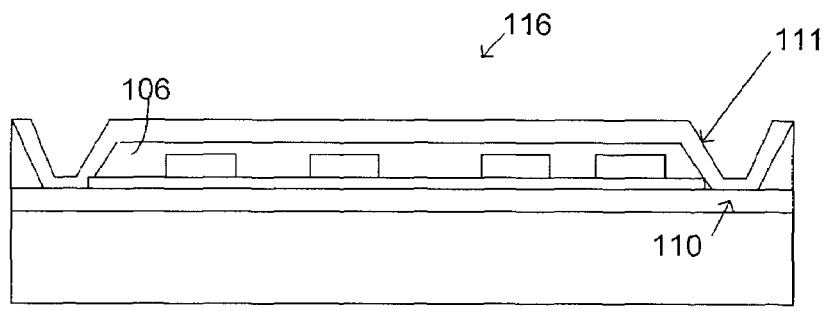
Figure 1G:
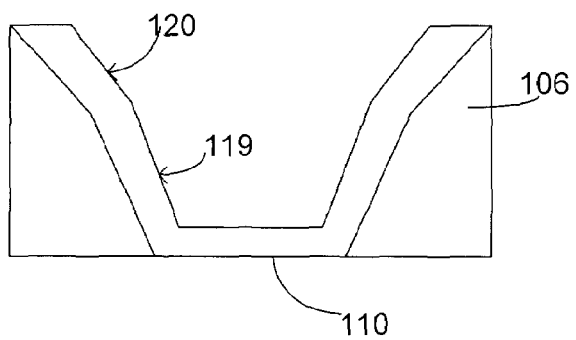

The magnetic via 110 structure/shape may be optimized to obtain good inductance within an inductive structure, such as the inductive structure 116 of FIG. 1*e* for example, according to a particular application. In another embodiment (referring to FIG. 1*f*), the magnetic via 110 of the inductive structure 116 may be formed to comprise a tapered sidewall 111. In another embodiment (FIG. 1*g*), the magnetic via 110 may be formed to comprise a beveled sidewall 111, wherein a first portion 119 of the sidewall 111 may be oriented at a different angle than a second portion 120 of the sidewall 111 of the magnetic via 110.

In some embodiments, the tapered and beveled sidewalls 111 may be formed by etching into the dielectric layer 106 to form tapered or beveled sidewalls. Tapering and/or beveling the magnetic via sidewalls may improve the magnetic properties of the magnetic material because the properties in the horizontal direction tend to be better than those in the vertical direction. This is because the magnetic domains are not disrupted when they extend into the magnetic via region when there is a more gradual slope.

Figure 1H:
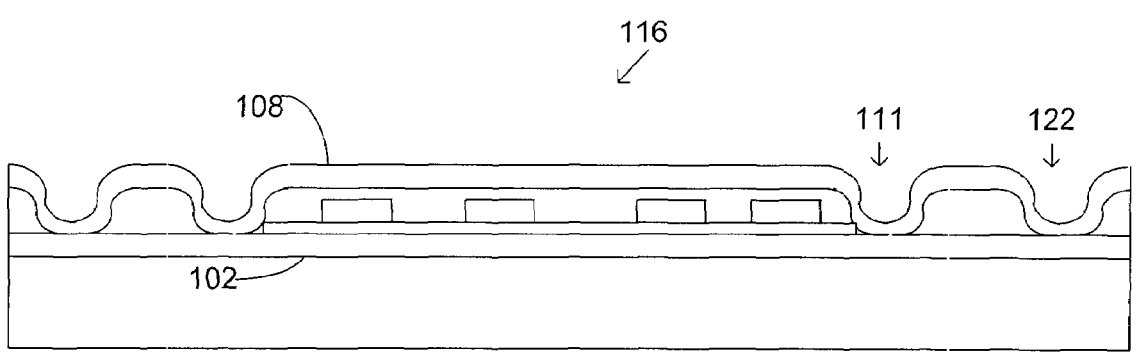

In one embodiment, the inductive structure 116 may comprise at least one additional magnetic via 122 that may be formed adjacent the magnetic via 111 (FIG. 1*h*). Additional magnetic vias can be used to reduce eddy currents in inductive structures. The eddy currents may then flow along the inner surface of the inner most magnetic vias 111 and then return in the outermost magnetic vias 122. The eddy currents may be reduced because the gaps between the inner magnetic vias 111 and the outer magnetic vias 122 may create a higher resistance.

Figure 1I:
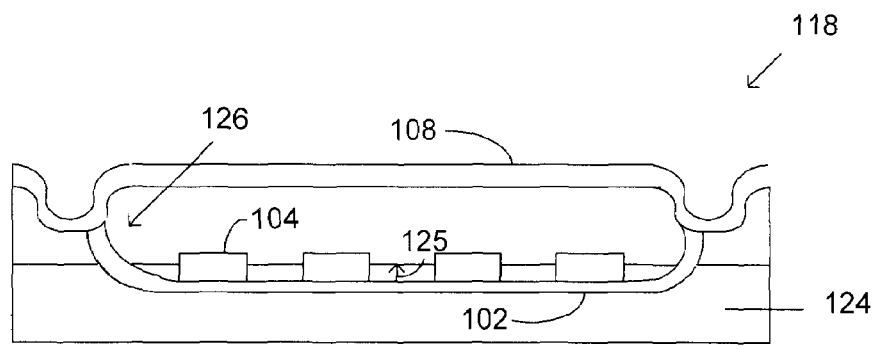
Figure 1J:
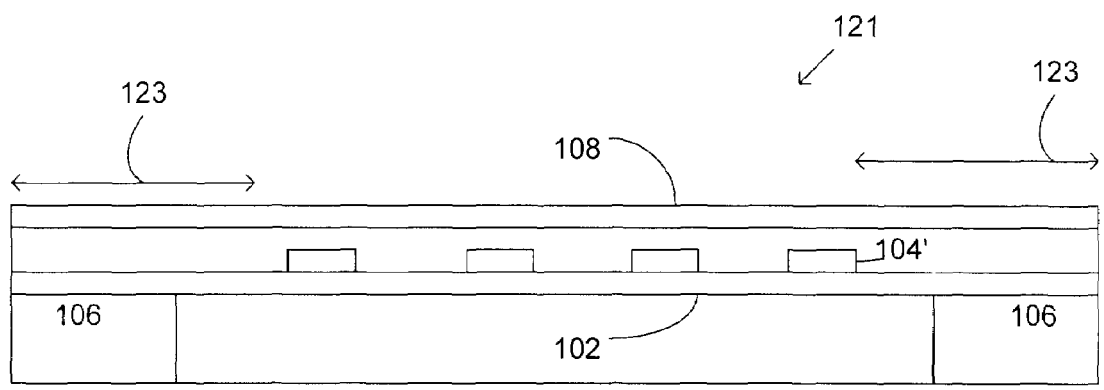
Figure 1K:
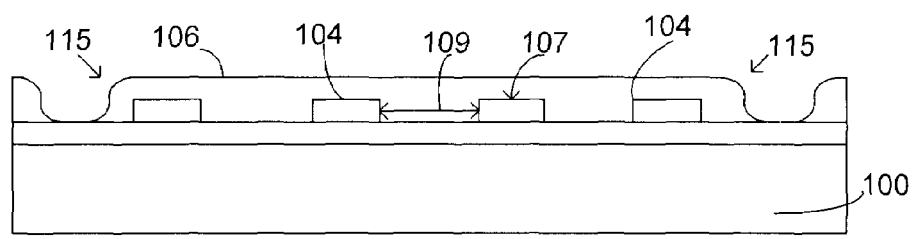
Figure 1L:
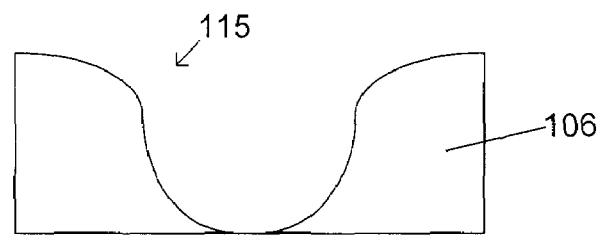
Figure 1M:
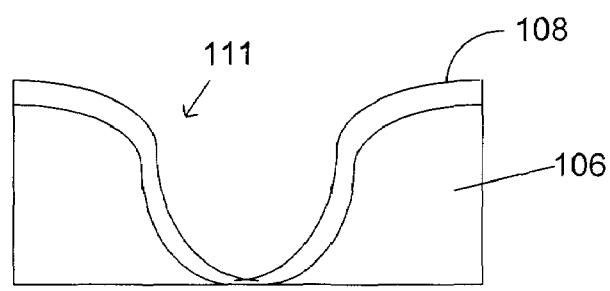

In another embodiment, a depression may be formed within a lower dielectric layer 124, such as an oxide layer, for example, disposed beneath the first layer of the magnetic material 102, wherein the at least one conductive structure 104 may be recessed a distance 125 into the lower dielectric layer 124 (FIG. 1*i*). The distance 125 depend upon the particular application, but may comprise about 0.5 to about 5 microns in an embodiment. The first layer and the second layer 102, 108 of the magnetic material may meet to form a substantially vertical region 126 at their region of intersection. This vertical region 126 serves to reduce the magnetic field intensity, thereby increasing the inductance of inductive structure 118.

In another embodiment (FIG. 1*j*), at least one of the first layer of magnetic material 102 and the second layer 108 of the magnetic material may be formed to extend a distance 123 beyond an edge of an end conductive structure 104'. The distance 123 may be optimized to maximize the magnetic inductance. In one embodiment, the distance 123 may comprise about 10 to about 50 microns, but will depend upon the particular application. If too long of a distance 123 is formed, the eddy current may be too high for optimum device performance. Extending the magnetic material in this manner may increase inductance without having to etch and form a magnetic via, although a magnetic via may optionally be formed in addition to the formation of the extension, in some embodiments. The magnetic flux will follow the second layer of magnetic material 108 until it bridges across the dielectric 106, and then connects to the first layer of magnetic material 102.

Figure 2A:
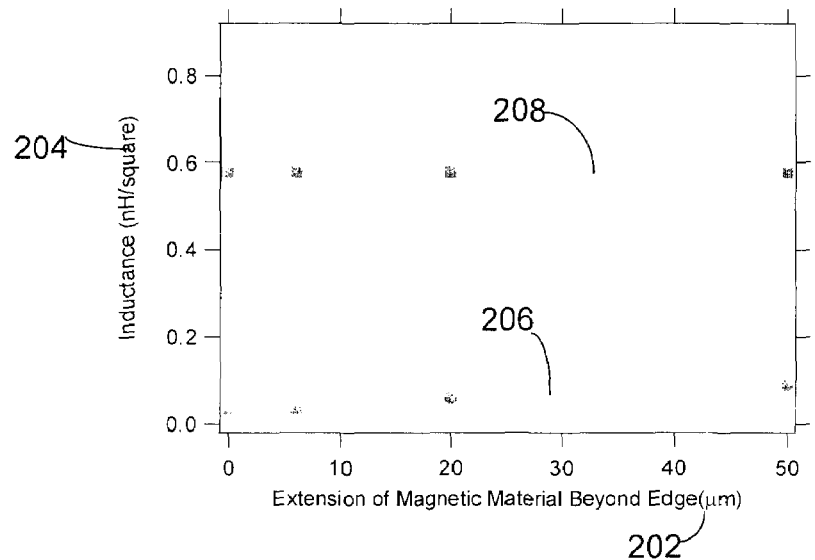
FIGS. 2a-2c represent graphs according to embodiments of the present invention.
Figure 2B:
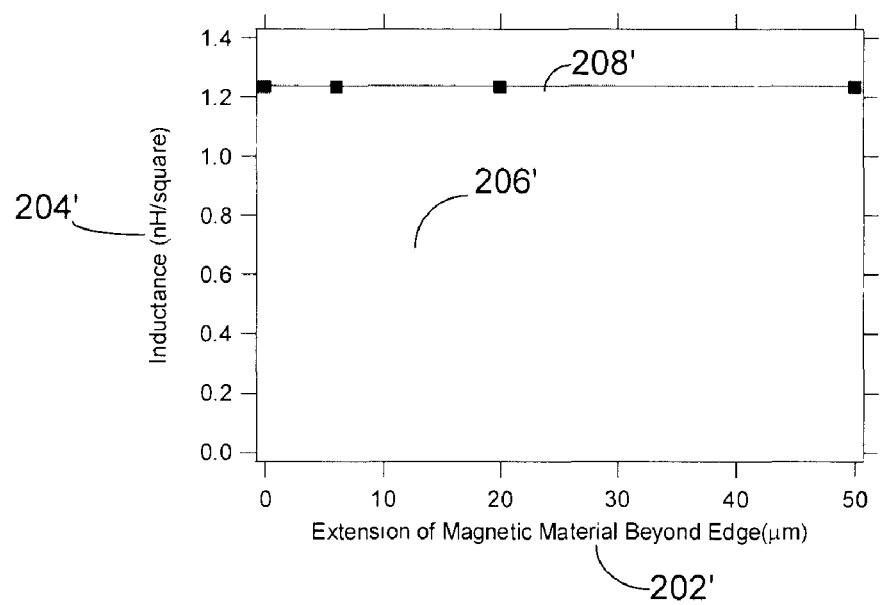

FIG. 2*a* depicts an inductance of single wire transformer 204 and FIG. 2*b* depicts an inductance of a 12 wire transformer 204' both without a magnetic via 206, 206' and with a magnetic via 208, 208' as a function of the distance of the extension of the magnetic material 202, 202' from the edge of and end conductive structure. In some cases, an increase in inductance can be obtained as the magnetic material extends up to about 50 microns beyond the edge of the end conductive structure.

In one embodiment, an equivalent shunt inductance for the magnetic via may be extracted from the inductive structure, such as the inductive structure 116 of FIG. 1e, for example, corresponding to an inductance contribution from the magnetic via. By extracting the magnetic shunt inductance mathematically, the contribution of the magnetic via inductance may be analyzed. The contribution of the magnetic via to the overall inductance can be thought of as a shunt inductance that is in parallel with the inductance of the "sandwich" structure of the conductive structures sandwiched between the first layer and the second layer of magnetic material.

Figure 2C:
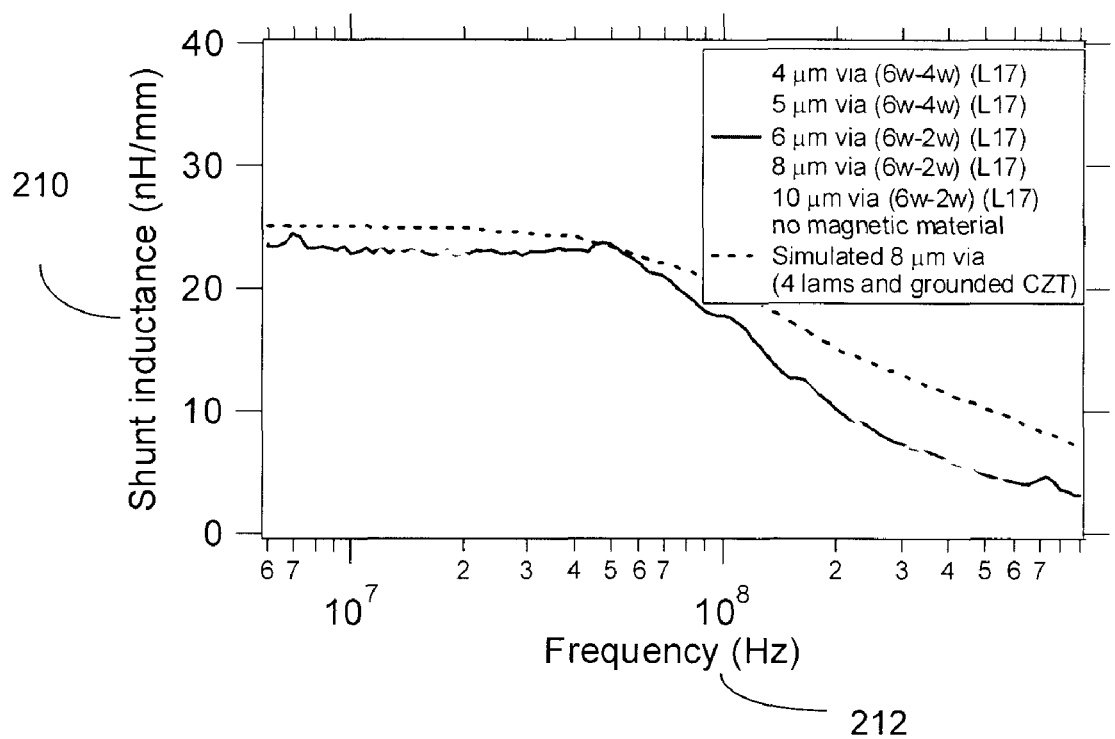

FIG. 2c depicts a graph of measured and simulated shunt inductance 210 of transformer structures as a function of frequency and via width 212. The shunt inductance 210 asymptotically approaches a maximum value with increasing via width. However in some cases, it may be undesirable to make the via too wide because this will increase the eddy currents which may affects the high frequency response of the inductor.

Benefits of the present invention include providing methods of fabricating magnetic vias fashioned to maximize inductance for inductive devices utilizing magnetic materials in integrated circuits. Inductive devices such as inductors and transformers may be fabricating according to the embodiments of the present invention. Circuits such as operational voltage converter circuits may be fabricated using on-chip and/or on package transformers, capacitors, and inductors with magnetic materials according to embodiments of the present invention, and such circuits may be utilized in server and mobile applications, for example. Fully-integrated voltage converters including those used in multicore processors that need micro-level management of power may benefit from the use of structures according to embodiments of the present invention.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices, such as inductive structures, are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method of forming an inductive structure comprising:
   forming a first layer of a magnetic material on a substrate,
   forming a thin dielectric layer on the first layer of the magnetic material;
   forming at least one conductive structure on the thin dielectric layer;
   forming a dielectric layer on the at least one conductive structure, wherein the edges of the dielectric layer are rounded;
   forming a second layer of the magnetic material on the at least one conductive structure; and
   forming a magnetic via coupled to the first and second layers of the magnetic material, wherein the magnetic via is shaped to increase the inductance of the inductive structure.

2. The method of claim 1 further comprising wherein the magnetic via is shaped as a rounded sidewall.

3. The method of claim 1 further comprising wherein the dielectric layer is formed with a rounded edge.

4. The method of claim 1 further comprising wherein the magnetic via is formed with an aspect ratio of about 0.5 to about 1.5.

5. The method of claim 1 further comprising wherein the magnetic via comprises a region where the first and second layers of the magnetic material contact each other.

6. The method of claim 1 further comprising wherein the first layer of magnetic material and the second layer of magnetic material extend beyond an edge of an end conductive structure.

7. The method of claim 1 further comprising wherein a depression is formed within a lower dielectric layer disposed beneath the first magnetic layer, and wherein the at least one conductive structure is recessed into the lower dielectric layer.

8. The method of claim 1 wherein an equivalent shunt inductance is extracted corresponding to an inductance contribution from the magnetic via.

9. The method of claim 1 further comprising forming at least one additional magnetic via adjacent to the magnetic via.

10. A structure comprising:
    a first layer of a magnetic material disposed on a substrate;
    a thin dielectric layer disposed on the first layer of the magnetic material;
    at least one conductive structure disposed on the first magnetic layer;
    a dielectric layer disposed on the at least one conductive structure;
    a second layer of the magnetic material disposed on the at least one conductive structure; and
    a magnetic via coupled to the first and second layers of the magnetic material, wherein the magnetic via comprises a tapered sidewall, wherein the angle of the tapered sidewall is substantially the same throughout the tapered sidewall.

11. The structure of claim 10 wherein the magnetic via comprises a region where the first and second layers of the magnetic material contact each other.

12. The structure of claim 10 wherein the magnetic via comprises an aspect ratio of about 0.5 to about 1.5.

13. The structure of claim 10 further comprising at least one additional magnetic via adjacent to the magnetic via.

14. The structure of claim 10 further comprising wherein the first layer of the magnetic material and the second layer of magnetic material extend beyond an edge of an end conductive structure.

15. The structure of claim 10 further comprising a depression within a lower dielectric layer disposed beneath the first layer of magnetic material, wherein the at least one conductive structure is recessed into the lower dielectric layer.

16. The structure of claim 15 wherein the first layer and second layer of the magnetic material meet to form a substantially vertical region.

17. The structure of claim 10 wherein the structure comprises a portion of at least one of an on-chip and on-package voltage converters, an RF high-frequency circuit, an EMI noise reduction circuit and radar circuitry.

18. The method of claim 1 wherein an electroplating process is employed to form the magnetic material.

19. The method of claim 18 wherein the electroplating process implements a photoresist material on a top surface of a seed layer disposed on the first layer.

* * * * *